United States Patent [19]

Jain

[11] Patent Number: 4,955,031
[45] Date of Patent: Sep. 4, 1990

[54] METAL INSULATOR SEMICONDUCTOR HETEROSTRUCTURE LASERS

[75] Inventor: Faquir C. Jain, Storrs, Conn.

[73] Assignee: University of Connecticut, Storrs, Conn.

[21] Appl. No.: 217,637

[22] Filed: Jul. 12, 1988

[51] Int. Cl.⁵ .............................................. H01S 3/19
[52] U.S. Cl. ...................................... 372/45; 372/43; 372/44; 357/16; 357/17
[58] Field of Search ............... 357/16, 17, 61; 372/43, 372/44, 45, 47

[56] References Cited

U.S. PATENT DOCUMENTS

| | | | |
|---|---|---|---|
| 3,735,212 | 5/1973 | Kun | 357/61 |
| 3,920,491 | 11/1975 | Yonezu | 357/17 |
| 4,819,039 | 4/1989 | Chi et al. | 357/17 |

FOREIGN PATENT DOCUMENTS

| | | | |
|---|---|---|---|
| 0016393 | 1/1984 | Japan | 357/17 |
| 0247577 | 10/1987 | Japan | 357/17 |

OTHER PUBLICATIONS

F. C. Jain, ZnSe-ZnS$_x$Se$_{1-x}$ and ZnSe-Zn$_{1-x}$Mn$_x$Se Metal-Insulator Semiconductor Heterostructure Lasers, J. Crystal Growth, 86, (1988), 929-934.
L. Kolodziejski, T. Sakamoto, R. Gonshor and S. Datta, "Molecular Beam Epitaxy of Cd$_{1-x}$Mn$_x$Te," Appl. Phys. Lett., 44, (8), Apr. 15, 1984, pp. 799-801.
Y. Yang, Ph Keesom and J. Furdyna, "Magnetic Susceptibility and the Spin-Glass Transition of Cd$_{1-x}$Mn$_x$S and Zn$_{1-x}$Mn$_x$S at Low Temperature", J. Solid State Chem., 49, 20-24, (1983), p. 20.
G. S. Osbourn, "Electronic Properties of Strained-Layer Superlattice", J. Voc. Sci. Technol B 1(2), Apr.-Jun. 1983, p. 379.
G. S. Osbourn, "Strained Layer Superlattices from Lattice Mismatched Materials", J. App. Phys., 53(3), Mar. 1982, pp. 1586-1589.
T. Steiner and M. Thewalt, "Photoluminescence Lifetimes of Bound Excitons in ZnSe", Solid State Comm., vol. 56, No. 11, pp. 933-936, 1985.
J. Bouley, P. Blanconnier, A. Herman, P. Henoc and J. Noblanc, "Luminescence in Highly Conductive n-type ZnSe", J. Appl. Phys., vol. 46, No. 8, Aug. 1975, p. 3549.
W. Leigh and B. Wessels, "High Conductivity Zinc Sulphoselenide Thin Films", Appl. Phys. Lett., vol. 41, No. 2, Jul. 15, 1982, pp. 165-167.
A. Catano and Z. Kun, "Growth and Characterization of ZnSe and Homogeneous ZnS$_x$Se$_{1-x}$Crystals", J. Crystal Growth, 33, (1976), 324-330.
L. Shon, K. Inoue and K. Murase "Raman Probing of ZnTe-ZnS Strained Layer Superlattices", Solid State Comm., vol. 62, No. 9, 1987, pp. 621-625.
M. Yamaguchi and A. Yamamto, "Blue Electroluminescence from a ZnSe MIS Structure", Japanese Journal of Appl. Phys., vol. 16, No. 1, Jan., 1977, pp. 77-84.
J. Merz, K. Nassau and J. Shiever, "Pair Spectra and the Shallow Acceptors in ZnSe", Phys. Rev. B., vol. 8, No. 4, Aug., 1973, p. 1444.
(List continued on next page.)

Primary Examiner—Rolf Hille
Assistant Examiner—Minh L. Tran

[57] ABSTRACT

A metal insulator semiconductor heterostructure laser emitting in the blue spectrum is formed by a substrate of n-type zinc selenide, zinc sulfoselenide (ZnSSe) and zinc manganese selenide (ZnMnSe); a confining layer of n-type zinc sulfoselenide, or zinc manganese selenide (ZnMnSe); an active layer of n-type zinc selenide or zinc sulfoselenide (ZnSSe) or zinc manganese selenide (ZnMnSe); a thin insulator layer and a top layer of reflective barrier metal stripes and thick insulating material. An applied potential with the metal stripes being positive injects minority holes into the active layer which combine with a n-type electron to produce photons. The barrier metal stripes and thin insulator layer combine to provide an inverted active layer surface which is instrumental in injecting minority holes. The generated photons are confined in the active layer by the barrier metal on one side and the confining layer on the other.

10 Claims, 2 Drawing Sheets

OTHER PUBLICATIONS

J. Nishizawa, K. Itoh, Y. Okuno, F. Sakurai, M. Koike and T. Teshmia, "Recent Advances in Visible LEDs", IEDM 83, 1983, IEEE, pp. 311-314.

A. Papadopoulo and P. Ged., "Investigations of Electroluminescent Junctions in ZnSe", IEEE Trans. Elec. Devices, vol. ED-26, No. 8, Aug. 1969, p. 1206.

T. Wagner, G. Heckelmann and H. Nelkowski, "Optical Reflectivity and Electronic Structure of $ZnS_xSe_{1-x}$ Mixed Crystals", Phys. Stat. Sol. B 65-K 75, 1974, p. K75.

M. Yamaguchi, A. Yamamoto and M. Kondo, "Photoluminescence of ZnSe Single Crystals Diffused with a Group-III Element", App. Phys., 48 (12), Dec. 1977, p. 5237.

K. Mochizuki and K. Suzuki, "Effect of the Stoichiometry Control of the Photoelectrical Properties of $ZnS_xSe_{1-x}$", Phys. Stat. Sol. (a) 85-249, (1984), p. 249.

I. Catalano, A. Cingolani, M. Ferrara and M. Lugara, "Stimulated Photoluminescence of ZnSe", Solid State Comm., vol. 43, No. 5, 1982, pp. 371-374.

W. T. White, J. Yee and W. Orvis, "Two-Photon Absorption in ZnS Calculated by an Empirical Pseudopotential Method", App. Phys. Lett., vol. 50, No. 17, 1987, p. 1128.

G. Beni, T. Rice, "Theory of Electron-Hole Liquid in Semiconductors", Phys. Rev. B, vol. 18, No. 2, 1978, p. 768.

I. Strzalkowski, S. Joshi and C. Crowell, "Dielectric Constant and Its Temperature Dependence for GaAs, CdTe, and ZnSe", App. Phys. Lett., vol. 28, No. 6, 1976, p. 350.

A. Vaidyanathan and A. Guenther, "Band-Structure Calculations of the Two-Photon Absorption Coefficients of GaAs, InP, CdTe, and ZnSe", Physical Rev. B, vol. 24, No. 4, 1981, p. 2259.

L. Kolodziejski, R. Gunshor, N. Otsuka, S. Datta, W. Becker and V. Nurmikko, "Wide-Gap II-VI Superlattices", IEEE, J. Quanteem Electronics, vol. QE22, No. 9, Sep. 1986, pp. 1666-1676.

S. Fuke, H. Araki, K. Kuwahara and T. Imai, "The Effects of In Doping on the Heteroepitazial Growth of ZnS on GaP Substrates", J. Appl. Phys., 61 (11), Jun. 1, 1986, p. 5023.

N. Gordon, "Electroluminescence by Impact Excitation in ZnS:Mn and ZnSe:Mn Schottky Diodes", IEEE Trans. on Electron Devices, vol. Ed-28, No. 4, Apr. 1981, p. 434.

S. Fujita, H. Mimoto and T. Noguchi, "Photoluminescence in ZnSe Grown by Liquid-Phase Epitaxy from Zn-Ga Solution", J. App. Phys., vol. 50, No. 2, Feb. 1979, p. 1079.

R. Bylsma, W. Becker, T. Bonsett, L. Kolodziejski, R. Gunshor, M. Yamanishi and S. Datta, "Stimulated Emission and Laser Oscillations in $ZnSe-Zn_{1-x}Mn_xSe$ Multiple Quantum Wells at −453 nm", App. Phys. Lett., 47 (10), Nov. 15, 1985, pp. 1039-1041.

Ma Ke-Jun and W. Giriat, "The Study of Energy Gap In $Mn_xZn_{1-x}Se$", Solid State Comm., vol. 60, No. 12, pp. 927-929, 1986.

A. Twardowski, C. Denissen, W. DeJong, A. deWaele M. Demianiuk and R. Triboulet, "Spinglass Behaviour of $Zn_{1-x}Mn_xSe$ and $Zn_{1-x}Mn_x Te$ Semimagnetic Semiconductors", Solid State Comm., vol. 59, No. 4, pp. 199-203, 1986.

H. Fujiyasu, K. Mochizuki, "A Proposal for p-type $ZnS_{1-x}Se_xZnTe$ Superlattices".

METAL INSULATOR SEMICONDUCTOR HETEROSTRUCTURE LASERS

BACKGROUND OF THE INVENTION

The wide energy gap 11-VI semiconductors, such as zinc selenide and zinc selenide based ternary alloys, have been recognized as a desirable material to produce optoelectronic devices operating in the blue region of the visible light spectrum. They are compatible with silicon and gallium arsenide in terms of lattice structure and lattice parameter so that they are readily adapted to the manufacture of optoelectronic integrated circuits. However, they present problems since they do not permit formation of the typical p-n junctions due to the problems in obtaining both p- and n- type doping.

Metal-insulator-semiconductor (MIS) heterostructures have been found to produce blue light and such structures represent a desirable approach to the development of optoelectronic devices. However, it has been necessary to develop such a structure which can be fabricated relatively easily and economically and which will exhibit a high degree of efficiency.

It is an object of the present invention to provide a novel metal-insulator-semiconductor heterostructure laser which will generate light in the blue spectrum relatively efficiently.

It is also an object to provide such a semiconductor laser which can be fabricated relatively readily and relatively economically and which will exhibit good operating characteristics using a wide energy gap semiconductor.

Still another object of the present invention is to provide a relatively simple and efficient method for manufacturing such semiconductor lasers.

SUMMARY OF THE INVENTION

It has now been found that the foregoing and related objects and advantages may be readily attained in a metal-insulator-semiconductor heterostructure laser emitting light in the blue region of the visible spectrum which is formed from a series of strata upon a substrate which has at least its top surface portion formed by zinc selenide (ZnSe), zinc manganese selenide (ZnMnSe) or zinc sulfoselenide (ZnSSe). Disposed thereon are a confining layer of zinc sulfoselenide (ZnSSe), or zinc manganese selenide (ZnMnSe) and an active layer of n-type zinc selenide (ZnSe), zinc manganese selenide (ZnMnSe), or n-type zinc sulfoselenide (ZnSSe). Disposed over the active layer are thin insulator layer and a top layer of alternating stripes of reflective barrier metal and a thick insulating material. The thin insulator layer and barrier metal act in concert to provide an inverted semiconductor surface, (underneath the thin insulator) whereby a potential applied across the top metal layer and substrate injects minority holes into the active layer to produce photons from the recombination of electrons and holes in the active layer. These photons are reflected from the confining layer underneath the active layer and barrier metal stripes of the top layer until discharged at an end of the active layer.

Preferably, the metal is selected from the group of metals having large work function valves and consisting of gold, platinum, palladium, iridium, rhodium and alloys thereof. The barrier metal stripes have a thickness of about 0.05-1.0 micron and a width of about 10-150 microns.

If so desired, the substrate may be composite with base portion of a semiconductor compatible with zinc selenide (ZnSe), such as gallium arsenide.

The confining layer may have a corrugated interface of zinc sulfur selenide to provide a distributed feedback structure. This corrugated confining layer is comprised of n-ZnS$_x$Se$_{1-x}$ (wherein x=0.12-0.20) and n-ZnS$_y$Se$_{1-y}$ (wherein y is equal to or greater than 0.3).

Desirably, the active layer has a thickness of about 0.02-0.5 micron, and the thickness is in the range of about 0.02-0.05 micron for a single quantum level.

In the method for making such heterostructure laser in the visible spectrum, there is deposited upon a substrate having at least its top surface portion formed by zinc selenide (ZnSe), zinc manganese selenide (ZnMnSe), or zinc sulfoselenide (ZnSSe), a confining layer of zinc sulfoselenide (ZnSSe) or zinc manganese selenide (ZnMnSe). An active layer of n-type zinc selenide (ZnSe), zinc manganese selenide (ZnMnSe), or zinc sulfoselenide (ZnSSe) With loWer Sulfur concentration than the confining layer is then deposited upon the confining layer, and a thin insulator layer is deposited upon the active layer. A top layer is formed with alternating stripes of reflective barrier metal and thick insulating material, and the thin insulator layer and barrier metal act in concert to provide an inverted surface.

DETAILED DESCRIPTION OF THE ILLUSTRATED EMBODIMENTS

Figure 1:
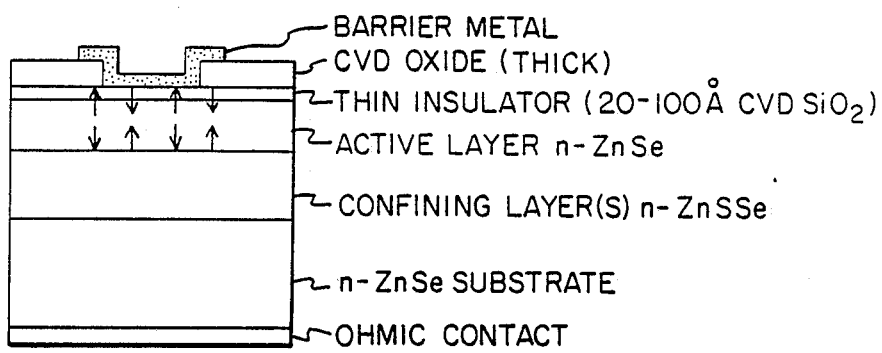
FIG. 1 is a diagrammatic cross sectional view of a metal-insulator-semiconductor heterostructure laser having a cavity-type sripe geometry configuration and embodying the present invention.

Turning first to FIG. 1, therein illustrated is a metal-insulator-semiconductor heterostructure laser embodying the present invention which includes a substrate of n-type zinc selenide upon which are disposed a confining layer of n-type zinc sulfur selenide and a active layer of n-type zinc selenide. Disposed upon the top of the active layer is a thin insulating layer of silicon dioxide and a top layer consisting of alternating stripes of the barrier metal and of a thick insulating oxide or nitride. The arrows indicate the motion of the photons generated in the active layer and their reflection from the metal stripe and confining layer. Also shown is the ohmic contact on the substrate to complete the electrical connection.

Figure 3:
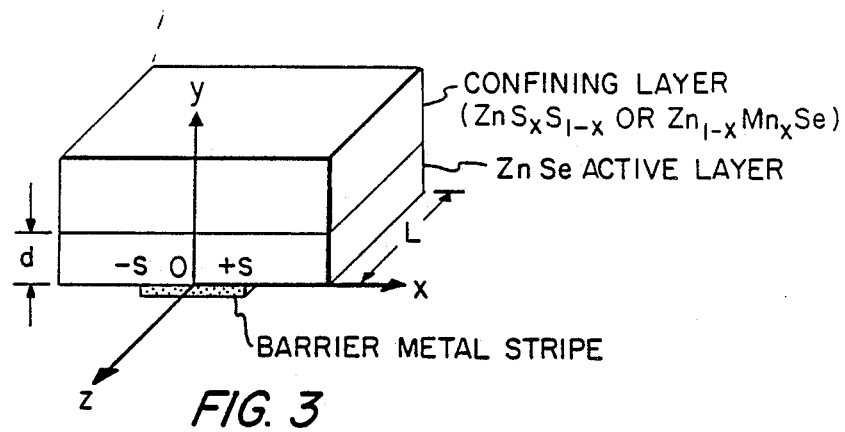
FIG. 3 is a schematic view of the structures of FIG. 1 and 2 showing the wave guide action for the stripe geometry, cavity-type device in FIG. 1.
Figure 2A:
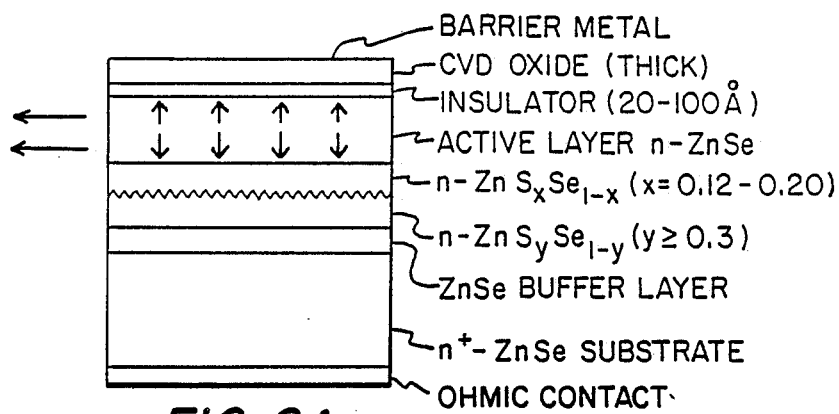
Figure 4:
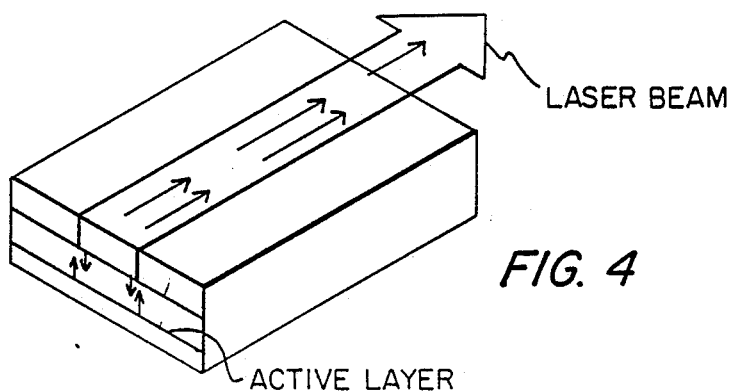
FIG. 4 is a schematic perspective view of the semiconductor heterostructure laser of FIG. 1.

As seen in FIG. 3, an applied potential to this multilayer structure causes the recombination of electrons and hole pairs which leads to the formation of photons in the active layer. Photons are confined in the active layer by reflection from the barrier metal and the confining layer to produce an optical pumping action. Ultimately, the photons are emitted from an end of the active layer of the semiconductor structure in accordance with conventional semiconductor laser operation as shown by the arrows in FIG. 4.

Figure 2:
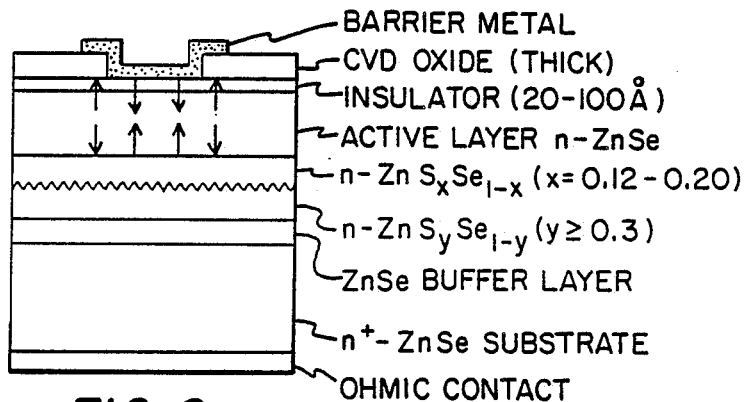
FIG. 2 is a similar diagrammatic view of another embodiment of heterostructure laser of the present invention.

In the embodiment of FIG. 2, there is illustrated a distributed feedback structure having an n-type zinc selenide substrate, a superimposed zinc selenide buffer structure, and a confining layer comprised of a pair of strata, both n-type zinc sulfur selenide, the lower layer having the formula $ZnS_ySe_{1-y}$ (wherein "y" equals or is greater than 0.3) and the upper layer having the formula $ZnS_xSe_{1-x}$ (wherein "x" equals 0.12–0.20).

The substrate may be homogeneous or a heterogeneous structure comprising a zinc selenide, zinc manganese selenide (ZnMnSe), or zinc sulfoselenide upper portion and a compatible semiconductor therebelow, i.e. one which is compatible in lattice parameter and thermal expansion such as gallium arsenide and silica. Generally, the substrate will have a total thickness in the range of 0.002–0.015 inch and preferably within the range of 0.005–0.010 inch.

The confining layer (or layers) is comprised of zinc sulfoselenide (ZnSSe), or zinc manganese selenide ($Zn_{1-x}MN_xSE$) and has a thickness of 0.2 to 2.0 microns, preferably about 0.5–1.0 micron. As indicated above with respect to the embodiment of FIG. 2, this layer may be comprised of a selenide of two different compositions. This layer must have a lower index of refraction and wider energy gap than the active layer. This can be achieved by increasing the sulfur content.

The active layer is comprised of n-type zinc selenide, n-type zinc manganese selenide (ZnMnSe), or n-type zinc sulfoselenide and its thickness within the range of 0.02–0.5 micron will depend upon whether a single or multiple quantum well type structure is desired. If a single well quantum structure is desired, then the thickness will normally be in the range of 0.02–0.05 micron. If not, the thickness will normally be in the range of 0.1–0.5 micron.

The thin insulating layer is conveniently comprised of silicon dioxide, aluminum oxide, silicon nitride or polymeric materials which will combine with the barrier metal stripes to produce an inversion layer on the surface of the active layer. It will normally have a thickness on the order of 20–100 Angstroms. The key factor is that it must have an effective energy gap which is greater than the lasing wavelength so as not to absorb photons.

The barrier metal stripes are deposited by vacuum deposition or sputter coating techniques and will normally have a thickness within the range of 0.05–1.0 micron, and preferably 0.1–0.5 micron. As indicated with respect to the thin insulating layer, the barrier metal must act in conjunction with the insulating layer so that the surface of the active layer is inverted. In addition, the barrier metal surface should be selected so as to reflect the photons back into the active layer. The stripes will normally range in width from 10 microns to 150 microns and the length may vary widely up to 300 microns. The width is determined by the type of modes desired in the output of the laser beam. Generally, the length is on the order of 100–300 microns.

The top layer additionally includes a chemically deposited thick insulating coating alternating with the metal stripes, and suitable materials comprise silicon dioxide, silicon nitride and aluminum oxide. The purpose of this layer is to provide insulation between adjoining lasers fabricated on the same chip. In addition, it can be used to bond wire to the top metal contact for biasing purposes.

The metal stripes may be developed by either additive or subtractive processes. Generally it is more convenient to deposit the desired metal coating over the entire surface of the structure, and then a photoresist pattern is developed and the unprotected metal is etched. The insulator coating is then applied, and the photoresist is removed to leave the insulator material between the metal stripes.

In the illustrated structure, the n-ZnSSe provides the electronic barrier and dielectric discontinuity for the confinement of injected minority carriers and generated photons, respectively. The outer n-ZnSe layer acts as the substrate. The structure is forward biased to obtain laser action, and the minority carriers are injected into the n-ZnSe active layer from a localized, two-dimensional (2D) inversion layer (e.g., 2D hole gas) induced on the n-ZnSe surface at the $SiO_2$-nZnSe interface. The radiative recombination of minority holes with majority electrons results in photon generation.

Emitted photons are confined in the active layer by the dielectric discontinuity provided by the n-ZnSe/n-$ZnS_xSe_{1-x}$ heterointerface on one side and the perfectly reflecting surface of the barrier metal on the other. The energy gap discontinuity $E_g$ at the ZnSe/ZnSSe interface also acts as a confiner of the minority carrier. It should be noted that the magnitude of the dielectric discontinuity in the ZnSSe/ZnSe system is somewhat smaller in magnitude than that in AlGaAs/GaAs structures.

In the distributed feedback structure of FIG. 2, the injected minority carriers are confined to the ZnSe active layer by the $ZnSe-ZnS_xSe_{1-x}$ heterostructure energy gap discontinuity on one side and the electronic barrier of the metal-insulator interface on the other in a manner similar to that in the cavity-type structure of FIG. 1. Photon confinement in the active layer is achieved by the reflecting surface of the barrier metal and the heterojunction dielectric discontinuity. The optical feedback is provided by the corrugated ZnSSe/ZnSSe interface in a manner similar to that of conventional p-n double heterostructure double feedback injection lasers.

In contrast to the p-n junction type double feedback lasers, the metal insulator semiconductor structure of FIG. 2 consists of fewer layers. This is important not only in fabrication but also in the integratability with optical waveguides and other optoelectronic components.

Modal analysis of stripe geometry single mode MIS lasers of FIG. 3, involving both lateral and transverse modes, has been reported, and this treatment can be used for ZnSe-ZnSSe system. The modes of single mode metal insulator semiconductor lasers differ primarily from p-n double heterostructure (DH) lasers in terms of the contribution due to transverse field distributions. The Hermite-Gaussian form of the lateral component (along the junction plane x-z in FIG. 3 is quite similar to p-n double heterostructure lasers, even though the expression for the total field is different. An appropriate selection of stripe width 2S and active layer thickness d will result in single mode operation for a given metal-insulator-semiconductor heterostructure.

The modal behavior of single mode stripe geometry ZnSe/ZnSSe MIS-DFB laser can be analysed using the technique of coupled-wave theory developed for double heterostructure lasers. However, the analysis will be significantly different due to the presence of the metal layer in the metal-insulator-semiconductor structure. The influence of the metal layer can be considered adequately by using the image theory approach. It seems that the modes of an metal-insulator-semiconductor distributed feedback laser will correspond to the modes of a doubly corrugated conventional double feedback laser having an active layer of thickness 2d.

The insulating coating (and insulating layer) is preferably deposited by metallorganic or vacuum techniques. Tetraethyl orthosilicate may be used to deposit the preferred silicon dioxide in an organometallic process.

The several other layers upon the substrate are conveniently formed by chemical vapor deposition and/or molecular beam epitaxial techniques.

Thus, it can be seen from the foregoing detailed description that the present invention provides a metal-insulator-semiconductor heterostructure laser which may be fabricated relatively simply to generate light in the blue spectrum with a high degree of efficiency.

Having thus described the invention, what is claimed is:

1. A metal insulator semiconductor (MIS) heterostructure laser emitting light in the blue region of the visible spectrum having the following strata extending along the length thereof:
   (a) a substrate having at least its top surface portion formed by a compound selected from the group consisting of zinc selenide (ZnSe), zinc sulfoselenide (ZnSSe), zinc manganese selenide (ZnMnSe);
   (b) a confining layer of a compound selected from the group consisting of zinc sulfoselenide (ZnSSe) and zinc manganese selenide (ZnMnSe);
   (c) an active layer of a compound selected from the group consisting of n-type zinc selenide (ZnSe), n-type zinc sulfoselenide (ZnSSe) and n-type zinc manganese selenide (ZnMnSe);
   (d) a thin insulator layer of a material having an effective energy gap which is greater than a lasing wave length;
   (e) a top layer of alternating stripes of reflective barrier metal and thick insulating material, said thin insulator layer and barrier metal acting in concert to provide an inverted surface at the active layer; and
   (f) an electrical contact on said substrate, thereby a potential applied across said top metal layer and substrate causes the barrier metal to inject minority holes into said active layer to produce photons from the recombination electrons and holes in said active layer, said photons being reflected from said confining layer and metal stripe of said top layer along the length thereof and being discharged from said active layer at an end of said layer.

2. The semiconductor laser in accordance with claim 1 wherein said metal is selected from the group consisting of gold, platinum, palladium, iridium, rhodium and alloys thereof.

3. The semiconductor laser in accordance with claim 1 wherein said substrate has a base portion of a semiconductor compatible with the zinc selenide compound.

4. The semiconductor laser in accordance with claim 3 wherein said compatible semiconductor is gallium arsenide.

5. The semiconductor laser in accordance with claim 1 wherein said active layer has a thickness of about 0.02–0.5 micron.

6. The semiconductor laser in accordance with claim 5 wherein said active layer has a thickness in the range of about 0.02–0.05 micron for a quantum level structure.

7. The semiconductor laser in accordance with claim 1 wherein said barrier metal stripes have a thickness of about 0.05–1.0 micron.

8. The semiconductor laser in accordance with claim 1 wherein said barrier metal stripes have a width of about 10–150 microns.

9. A metal insulator semiconductor (MIS) heterostructure laser emitting light in the blue region of the visible spectrum having the following strata extending along the length thereof:
   (a) a substrate having at least its top surface portion formed by a compound selected from the group consisting of zinc selenide (ZnSe), zinc sulfoselenide (ZnSSe), zinc manganese selenide (ZnMnSe);
   (b) a confining layer of a compound selected from the group consisting of zinc sulfoselenide (ZnSSe) and zinc manganese selenide (ZnMnSe), said confining layer providing a corrugated interface of zinc sulfoselenide to provide a distributed feedback structure;
   (c) an active layer of a compound selected from the group consisting of n-type zinc selenide (ZnSe), n-type zinc sulfoselenide (ZnSSe) and n-type zinc manganese selenide (ZnMnSe);
   (d) a thin insulator layer of a material having an effective energy gap which is greater than a lasing wave length;
   (e) a top layer of alternating stripes of reflective barrier metal and thick insulating material, said thin insulator layer and barrier metal acting in concert to provide an inverted surface at the active layer; and
   (f) an electrical contact on said substrate thereby a potential applied across said top metal layer and substrate causes the barrier metal to inject minority holes into said active layer to produce photons from the recombination electrons and holes in said active layer, said photons being reflected from said confining layer and metal stripe of said top layer along the length thereof and being discharged from said active layer at the end of said laser.

10. The semiconductor laser in accordance with claim 9 wherein said confining layer is comprised of n-$ZnS_xSe_{1-x}$ (wherein x=0.12–0.20) and of n-$ZnS_ySe_{1-y}$ (wherein y is equal to or greater than 0.3).

* * * * *